United States Patent

Hirose et al.

[11] Patent Number: 5,958,645
[45] Date of Patent: Sep. 28, 1999

[54] RADIATION-SENSITIVE RESIN COMPOSITION

[75] Inventors: Kouichi Hirose; Masahiro Akiyama; Katsumi Inomata; Yoshiji Yumoto, all of Yokkaichi, Japan

[73] Assignee: Japan Synthetic Rubber Co., Ltd., Tokyo, Japan

[21] Appl. No.: 08/917,727

[22] Filed: Aug. 27, 1997

[30] Foreign Application Priority Data

Aug. 28, 1996 [JP] Japan ................................ 8-245535

[51] Int. Cl.⁶ ................................................ G03F 7/023
[52] U.S. Cl. ........................ 430/191; 430/165; 430/192; 430/193; 430/326
[58] Field of Search .................. 430/165, 191, 430/192, 193, 326

[56] References Cited

U.S. PATENT DOCUMENTS 4,818,658 4/1989 Martin et al. ........................... 430/191
5,334,481 8/1994 Merrem ................................ 430/191

FOREIGN PATENT DOCUMENTS 0 287 750 10/1988 European Pat. Off.
0 780 730 6/1997 European Pat. Off.
1-243046 9/1989 Japan.
2 217 864 11/1989 United Kingdom.

*Primary Examiner*—John S. Chu
*Attorney, Agent, or Firm*—Oblon, Spivak, McClelland, Maier & Neustadt, P.C.

[57] ABSTRACT

A radiation-sensitive resin composition comprising:
(i) an alkali-soluble resin;
(ii) a phenol compound represented by the following formula (1):

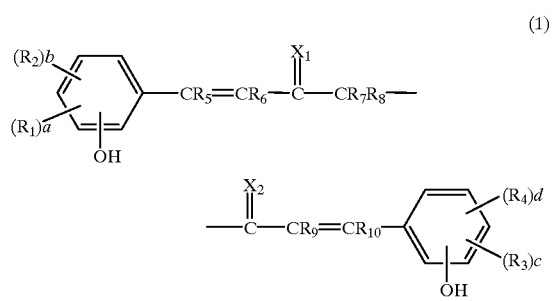

wherein $R_1$ to $R_4$ each represent halogen, alkyl, alkoxyl, aryl, nitro, cyano, hydroxyalkyl, hydroxyalkoxyl or hydroxyl; a, b, c and d each represent an integer of 0 to 4 and satisfying $0 \leq a+b \leq 4$ and $0 \leq c+d \leq 4$, provided that when a+b is 1 and c+d is 1 at least one of $R_1$ (or $R_2$) and $R_3$ (or $R_4$) is alkyl, hydroxyalkyl or hydroxyalkoxyl; $R_5$ to $R_{10}$ each represent hydrogen, alkyl or aryl; and $X_1$ and $X_2$ each represent oxygen or sulfur atom; and
(iii) a 1,2-quinonediazide compound. This composition has good resolution, sensitivity and developability, as well as has as a positive resist good focal latitude and heat resistance. The patterns formed have good shapes, and the composition may cause no fine particles during storage.

21 Claims, 2 Drawing Sheets

RADIATION-SENSITIVE RESIN COMPOSITION

BACKGROUND OF THE INVENTION

1. Field of the Invention

This invention relates to a radiation-sensitive resin composition containing an alkali-soluble resin. More particularly, this invention relates to a radiation-sensitive resin composition preferable as a resist used for fabricating integrated circuits, that is well sensitive to a variety of radiations including ultraviolet radiation such as g-rays and i-rays, far-ultraviolet radiation such as KrF excimer laser radiation, X-radiation such as synchrotron radiation, and charged-particle radiation such as electron radiation, in particular, ultraviolet radiation and far-ultraviolet radiation.

2. Description of the Prior Art

As integrated circuits have become more highly integrated in recent years, positive resist compositions used when the integrated circuits are fabricated are required to have superior performances in respect of resolution, sensitivity, depth of focus (focal latitude), heat resistance, developability and so forth.

In the manufacture of ultra LSI circuits, besides the requirement for the above performances, there is a demand for resist compositions restrained from the standing-wave effect due to the interference of irradiation light with light reflected from the substrate.

As a method for restraining halation of positive resists, U.S. Pat. No. 5,334,481 (1994) discloses a positive photosensitive composition containing as a light-absorbing dye a phenol compound represented by the following formula (2):

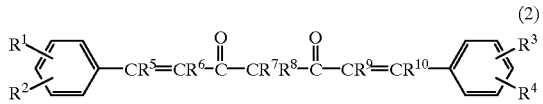

wherein $R^1$ to $R^4$ each represent a hydroxyl group or an alkoxyl group having 1 to 6 carbon atoms, and $R^5$ to $R^{10}$ each represent a hydrogen atom or an alkyl group having 1 to 6 carbon atoms. Japanese Post-examination Patent Publication (kokoku) No. 6-58530 also discloses a positive photosensitive composition containing novolak resin, benzophenone and 1,2-napthoquinonediazidosulfonic acid ester of curcumine.

However, even the above positive photosensitive compositions can not be satisfactory in the performances such as resolution, sensitivity, heat resistance and developability.

As a means for restraining the standing-wave effect, a technique to add a light-absorbing dye is added in resists has been developed. The light-absorbing dye, however, has caused the problem that a lowering of sensitivity, a shape deterioration of resist patterns and a poor dimensional stability concurrently thereby caused make it difficult to deal with the formation of fine patterns. In addition, there are problems that some light-absorbing dyes do not dissolve in solvents, may cause deposition of fine particles during storage, and may sublimate at the time of baking to make resist performances non-uniform.

SUMMARY OF THE INVENTION

Accordingly, an object of the present invention is to provide a radiation-sensitive resin composition that has a high resolution and a high sensitivity and has a superior developability, can form patterns in good shapes restrained from the standing-wave effect, and may cause no fine particles during its storage.

The above object can be achieved by a radiation-sensitive resin composition (hereinafter often "first composition") comprising;

(i) an alkali-soluble resin;

(ii) a phenol compound represented by the following formula (1):

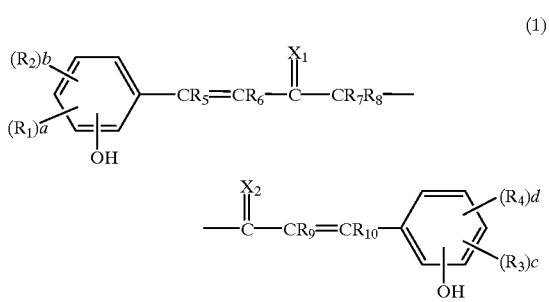

wherein $R_1$ to $R_4$ are the same or different and each represent a halogen atom, an alkyl group, an alkoxyl group, an aryl group, a nitro group, a cyano group, a hydroxyalkyl group, a hydroxyalkoxyl group or a hydroxyl group; a, b, c and d independently represent an integer of 0 to 4 and satisfying $0 \leq a+b \leq 4$ and $0 \leq c+d \leq 4$, provided that when a+b is 1 and c+d is 1 at least one of $R_1$ (or $R_2$) and $R_3$ (or $R_4$) to be present is an alkyl group, a hydroxyalkyl group or a hydroxyalkoxyl group; $R_5$ to $R_{10}$ are the same or different and each represent a hydrogen atom, an alkyl group or an aryl group; and $X_1$ and $X_2$ are the same or different and each represent an oxygen atom or a sulfur atom; and (iii) a 1,2-quinonediazide compound.

The object of the present invention can also be achieved by a radiation-sensitive resin composition (hereinafter often "second composition") comprising:

(i) an alkali-soluble resin; and (iiia) a 1,2-benzoquinonediazidosulfonic acid ester of the phenol compound represented by the above formula (1).

The radiation-sensitive resin composition of the present invention has a high resolution and a high sensitivity and has a superior developability. It also has as a positive resist a superior focal latitude and heat resistance, can form patterns with good shapes restrained from the standing-wave effect and may cause no settling of fine particles during storage. Hence, the present composition can be preferably used as a resist for the fabrication of integrated circuits.

DESCRIPTION OF THE PREFERRED EMBODIMENTS

First Composition

Figure 1A:
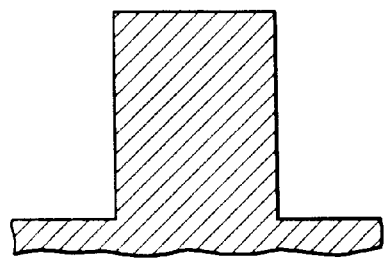
FIG. 1 illustrates cross-sectional shapes of resist patterns.

The first composition of the present invention will be described below in detail.

(i) Alkali-Soluble Resin:

The component (i) used in the composition of the present invention is an alkali-soluble resin (hereinafter often "resin (i)").

The resin (i) may include, e.g., alkali-soluble phenol resins, polyvinylphenol or derivatives thereof, a styrene-maleic anhydride copolymer or derivatives thereof, polyvinyl hydroxybenzoate, and acrylic acid resins containing a carboxyl group. Of these, alkali-soluble phenol resins are preferred.

The resin (i) may usually have an average molecular weight (hereinafter often "Mw") in terms of polystyrene, of from 300 to 20,000. In view of the operability required when the composition of the present invention is coated on a substrate, the developability required when used as a resist and the improvement in sensitivity and heat resistance, it may preferably have an Mw of from 2,000 to 20,000, and particularly preferably from 3,000 to 15,000. In particular, in the case of the alkali-soluble phenol resin, it may preferably have an Mw of from 5,000 to 14,000, and more preferably from 8,000 to 12,000.

The alkali-soluble phenol resin can be obtained by subjecting a phenol compound represented by the following formula (3):

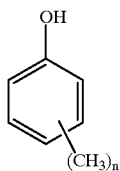

(3)

wherein n is an integer of 1 to 3, and an aldehyde compound such as a monoaldehyde compound or a bisaldehyde compound to polycondensation.

Preferred examples of the phenol compound are phenol, o-cresol, m-cresol, p-cresol, 2,3-xylenol, 2,5-xylenol, 3,4-xylenol, 3,5-xylenol, 2,3,5-trimethylphenol and 3,4,5-trimethylphenol, and particularly preferably phenol, m-cresol, p-cresol, 2,3-xylenol, 2,5-xylenol, 3,4-xylenol, 3,5-xylenol and 2,3,5-trimethylphenol.

Any of these phenol compounds may be used alone or in combination of two or more.

In the case when the phenol compound is used in combination of two or more, particularly preferred is, for example, a combination of m-cresol/p-cresol=30 to 95/5 to 70 (weight ratio), m-cresol/2,3-xylenol/3,4-xylenol=20 to 95/5 to 80/0 to 75 (weight ratio), or m-cresol/2,3,5-trimethylphenol/2,3-xylenolap=20 to 95/5 to 80/0 to 75 (weight ratio).

The monoaldehyde compound with which the phenol compound is subjected to polycondensation may include, e.g., formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and furfural.

The bisaldehyde compound may include glyoxal, glutaraldehyde, terephthalaldehyde, and isophthalaldehyde.

Of these, formaldehyde and o-hydroxybenzaldehyde are particularly preferred.

An of these aldehyde compounds may also be used alone or in combination of two or more.

The aldehyde compound may usually be used in an amount of from 0.7 to 3.0 mols, and preferably from 0.8 to 1.5 mols, per mol of the phenol compound.

Usually, in the polycondensation reaction of the phenol compound with the aldehyde compound, a catalyst such as an acidic catalyst or a basic catalyst is used. Such an acidic catalyst may include, e.g., hydrochloric acid, nitric acid, sulfuric acid, formic acid, oxalic acid, acetic acid and p-toluene sulfonic acid. The basic catalyst may include, e.g., sodium hydroxide and potassium hydroxide.

The acidic catalyst may usually be used in an amount of from $1\times10^{-5}$ to $5\times10^{-1}$ mol per mol of the phenol compound. The basic catalyst may usually be used in an amount of from $1\times10^{-12}$ to 1 mol per mol of the phenol compound.

As a reaction medium for the above polycondensation, water is usually used. If the reaction system is non-uniform from the beginning of the reaction when the water is used as the reaction medium, a hydrophilic solvent or a lipophilic solvent may be used.

The hydrophilic solvent may include, e.g., alcohols such as methanol, ethanol, propanol, butanol and propylene glycol monomethyl ether, and cyclic ethers such as tetrahydrofuran and dioxane.

The lipophilic solvent may include ketones such as methyl ethyl ketone, methyl isobutyl ketone and 2-heptanone.

Any of these reaction medium may usually be used in an amount of from 20 to 1,000 parts by weight based on 100 parts by weight of reactants comprised of the phenol compound and the aldehyde compound.

The temperature of the polycondensation reaction can be suitably adjusted according to reactivity of the reactants; normally a temperature in the range of 10 to 200° C. may be used.

The polycondensation may be carried out by appropriately employing a method in which the phenol compound, the aldehyde compound, the catalyst and so forth are charged together in a reaction vessel, or a method in which the phenol compound, the aldehyde compound and so forth are added to the reaction system with progress of the reaction.

After the polycondensation is completed, it is common to remove the unreacted materials, the catalyst, the reaction medium and so forth. More specifically, the temperature may be raised to 130° C. to 230° C. and volatile components may be removed under reduced pressure. Thereafter, the alkali-soluble phenol resin may be collected.

Especially in order to obtain a high molecular weight alkali-soluble phenol resin having a Mw of 2,000 to 20,000, the resin obtained in the manner described above is dissolved in a good solvent such as ethylene glycol monomethyl ether acetate, methyl 3-methoxypropionate, methyl isobutyl ketone, 2-heptanone, dioxane, methanol or ethyl acetate, and then a poor solvent such as n-hexane or n-heptane is mixed. The resin solution layer precipitating may be separated to obtain the alkali-soluble phenol resin having a high molecular weight.

The resin (i) may be used alone or in combination of two or more.

The resin (i) may preferably have an Mw of from 2,000 to 20,000 as described above. In order to promote the alkali-solubility of the resultant composition, it is desirable in some cases to use a low molecular weight alkali-soluble resin having a Mw of less than 2,000 in combination. The low-molecular weight alkali-soluble resin may preferably have an Mw in the range of 500 or more but less than 2,000.

Such a low-molecular weight alkali-soluble resin may include, e.g., low-molecular weight alkali-soluble novolak resins, and alkali-soluble polyhydroxystyrene and derivatives thereof. For example, it may include a phenol/formaldehyde condensed novolak resin, an o-cresol/formaldehyde condensed novolak resin, an m-cresol/formaldehyde condensed novolak resin, a p-cresol/formaldehyde condensed novolak resin, an m-cresol/p-cresol/formaldehyde condensed novolak resin, polyhydroxystyrene, and a hydroxystyrene-styrene copolymer.

The low-molecular weight alkali-soluble novolak resins can be obtained by subjecting a phenol compound and an aldehyde to polycondensation. As this phenol compound, besides those exemplified as the phenol compound used in the synthesis of novolak resins, 1-naphthol or 2-naphthol may be used. In this instance, the aldehyde may usually be used in an amount of from 0.2 to 0.8 mol, and preferably from 0.3 to 0.7 mol. As a catalyst or this polycondensation, the acidic catalyst described above may be used.

The low-molecular weight alkali-soluble resin may usually be mixed in an amount not more than 50 parts by weight based on 100 parts by weight of the high-molecular weight alkali-soluble resin having an Mw of from 2,000 to 20,000.

(ii) Phenol Compound:

The component (ii) is a phenol compound represented by the formula (1) (hereinafter often "phenol compound (ii)".

In the formula (1), $R_1$ to $R_4$ are the same or different and each represent a halogen atom, an alkyl group, an alkoxyl group, an aryl group, a nitro group, a cyano group, a hydroxyalkyl group, a hydroxyalkoxyl group or a hydroxyl group. In view of solubility of the composition in the solvent, they may preferably be each an alkyl group, a hydroxyalkyl group or a hydroxyalkoxyl group.

The alkyl group may preferably be an alkyl group having 1 to 4 carbon atoms, specifically including a methyl group, an ethyl group, a n-propyl group, an isopropyl group, a n-butyl group and a t-butyl group.

The alkoxyl group may preferably be an alkoxyl group having 1 to 4 carbon atoms, specifically including a methoxyl group, an ethoxyl group, a propoxyl group and a butoxyl group.

The aryl group may preferably be an aryl group having 6 to 10 carbon atoms, specifically including a phenyl group, a tolyl group and a naphthyl group.

The hydroxyalkyl group may preferably be a hydroxyalkyl group having 1 to 4 carbon atoms, specifically including a hydroxymethyl group, a hydroxyethyl group and a hydroxypropyl group.

The hydroxyalkoxyl group may preferably be a hydroxyalkoxyl group having 1 to 4 carbon atoms, specifically including a hydroxymethoxyl group, a hydroxyethoxyl group and a hydroxypropoxyl group.

Letter symbols a, b, c and d independently represent an integer of 0 to 4 and satisfying $0 \leq a+b \leq 4$ and $0 \leq c+d \leq 4$, provided that when a+b is 1 and c+d is 1, at least one of $R_1$ (or $R_2$) and $R_3$ (or $R_4$) to be present is an alkyl group, a hydroxyalkyl group or a hydroxyalkoxyl group.

$R_5$ to $R_{10}$ are the same or different and each represent a hydrogen atom, an alkyl group or an aryl group, and preferably a hydrogen atom. Preferred examples of the alkyl group and aryl group represented by $R_5$ to $R_{10}$ may be the same as those exemplified in relation to $R_1$ to $R_4$.

$X_1$ and $X_2$ are the same or different and each represent an oxygen atom or a sulfur atom. In view of a superior solubility in an aqueous alkali solution which is a developer of the phenol compound (ii), they may preferably be each an oxygen atom.

As examples of the phenol compound (ii), it may include compounds represented by the following formulas (4-1) to (4-8).

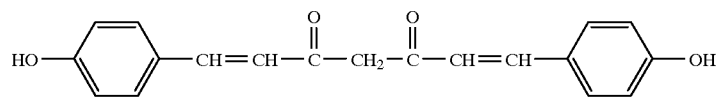

(4-1)

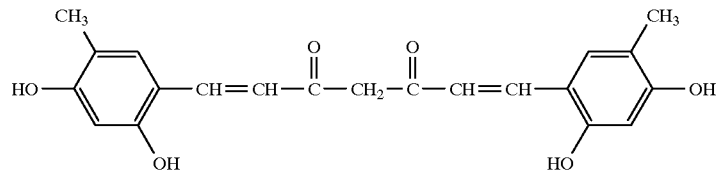

(4-2)

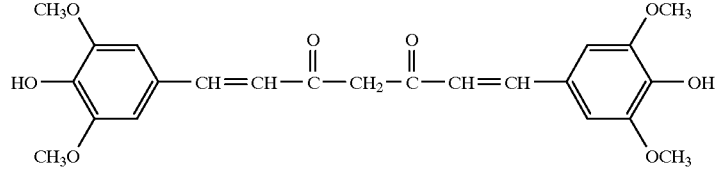

(4-3)

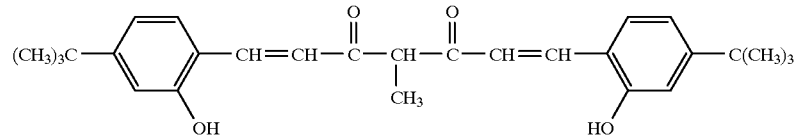

(4-4)

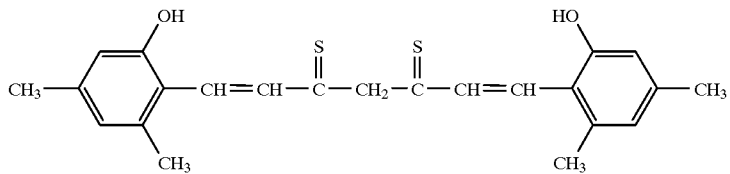
(4-5)

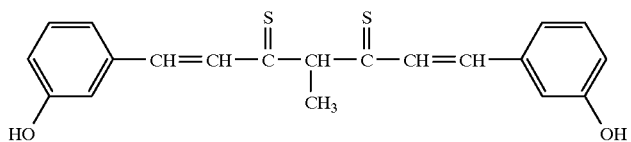
(4-6)

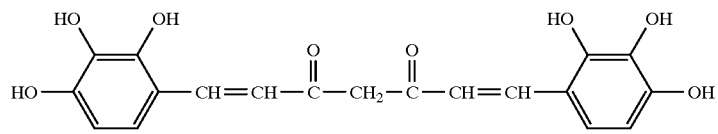
(4-7)

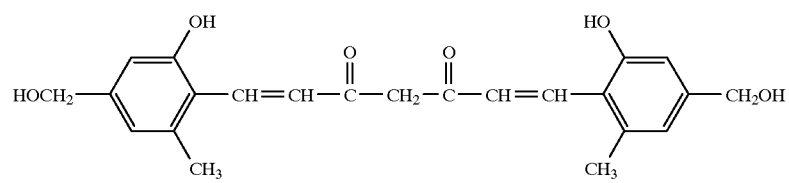
(4-8)

Of these compounds, those represented by the formulas (4-1), (4-2), (4-3) and (4-7) are preferred, and the compound represented by the formula (4-1) is particularly preferred.

The phenol compound (ii) can be obtained by, e.g., subjecting 2 mols of an aldehyde compound ① and 1 mol of a compound ② to condensation reaction in the presence of a basic catalyst, as shown by the following reaction scheme:

[In the scheme, $R_1$ to $R_{10}$, $X_1$ and $X_2$ and a to d are as defined previously.]

The basic catalyst used in this reaction may include, e.g., tetrahydro-1,4-oxazine, hexahydropyridine, triethylamine, n-butylamine, pyridine, N-ethylaniline, 1,2,3,4-tetrahydroquinoline, and N,N-dimethylformamide, and tetrahydro-1,4-oxazine, 1,2,3,4-tetrahydroquinoline and N,N-dimethylformamide are preferred. In this condensation

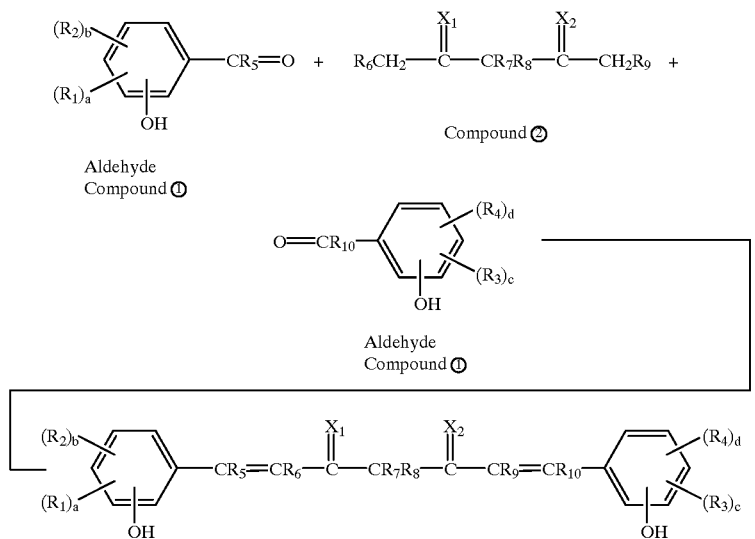

reaction, at least one of a compound containing boron such as boric acid or boron oxide and acetic acid may be used together with the basic catalyst. Stated additionally, the compound represent by, e.g., the formula (4-1) can be obtained from a natural product by purification such as extraction, but the compound obtained by a synthetic route is more preferred because metals and/or impurities are contained in a lower concentration or smaller quantity.

The phenol compound (ii) may usually be mixed in the composition in an amount of from 1 to 50 parts by weight, preferably from 3 to 40 parts by weight, and more preferably from 5 to 30 parts by weight, based on 100 parts by weight of the resin (i).

(iii) 1,2-Quinonediazide Compound:

As the component-(iii) 1,2-quinonediazide compound (hereinafter often "1,2-quinonediazide compound (iii)"), any of those conventionally known as radiation-sensitive agents of quinonediazide type positive resists may be used.

The 1,2-quinonediazide compound (iii) may include, e.g., 1,2-benzoquinonediazidosulfonic acid esters of phenol compounds such as 2,3,4-trihydroxybenzophenone, 2,3,4,4'-tetrahydroxybenzophenone, 2,3,4,2',4'-pentahydroxybenzophenone, tris(4-hydroxyphenyl) methane, 1,3,5-tris(4-hydroxy-α,α-dimethylbenzyl) benzene, 1,1-bis-(4-hydroxyphenyl)-1-[4-{1-(4-hydroxyphenyl)-1-methylethyl}phenyl]ethane, 2-(3,4-dihydroxyphenyl)-2-(4-hydroxyphenyl)propane, and 2,4,4-trimethyl-2-(2,4-dihydroxyphenyl)-7-hydroxycumarone; and 1,2-benzoquinonediazidosulfonic acid esters of the phenol compound represented by the formula (1). Any of these may be used alone or in combination of two or more. 1,2-Benzoquinonediazido-4-sulfonic acid ester and 1,2-benzoquinonediazido-5-sulfonic acid ester of any of these phenol compounds are preferred.

The 1,2-quinonediazide compound (iii) can be obtained by allowing the above phenol compound to react with, e.g., 1,2-naphthoquinonediazidosulfonyl chloride in the presence of a basic catalyst such as triethylamine.

In the first composition of the present invention, the 1,2-quinonediazide compound (iii) may usually be mixed in an amount of from 10 to 50 parts by weight, and preferably from 20 to 40 parts by weight, based on 100 parts by weight of the resin (i).

Second Composition

The second composition of the present invention will be described below.

The component-(i) alkali-soluble resin used in the second composition is the same as the resin (i) described in respect of the first composition. The previous description relating to the resin (i) all applies to this resin.

Component-(iiia)

1,2-benzoquinonediazidosulfonic acid ester used in the second composition is the compound described as one included in the 1,2-quinonediazide compound (iii) of the first composition. This second composition is chiefly characterized in that such a specific 1,2-quinonediazide compound is used.

In the second composition, the component-(iiia) may usually be mixed in an amount of from 1 to 30 parts by weight, preferably from 2 to 20 parts by weight, and particularly preferably from 3 to 15 parts by weight, based on 100 parts by weight of the component-(i).

Other Components

The composition (in the following description, the composition embraces the first composition and the second composition) of the present invention may be optionally mixed with various additives.

Dissolution Accelerator:

In the present invention, for the purpose of improving the alkali-solubility of the composition, it is possible to add a low-molecular weight phenol compound (hereinafter often "dissolution accelerator") which is other than the component-(ii) phenol compound represented by the formula (1). The dissolution accelerator may have a molecular weight of less than 2,000, and preferably from 200 to 1,000. This dissolution accelerator may preferably be a phenol compound having 2 to 5 benzene rings, which may include, e.g., compounds represented by the following formulas (5-1) to (5-9). Any of these may be used alone or in combination of two or more. Of these, those represented by the formulas (5-3), (5-5), (5-6) and (5-7) are particularly preferred.

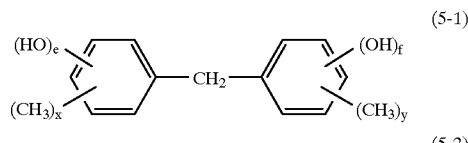

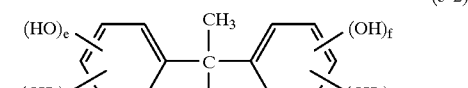

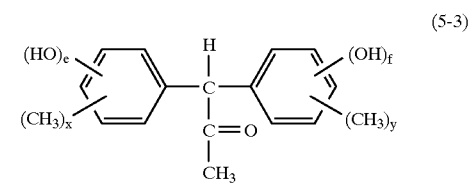

[In the formulas (5-1) to (5-3), e and f are independently an integer of 0 to 3, x and y are independently an integer of 0 to 3, provided that e and f are not 0 at the same time, $e+x \leq 5$ and $f+y \leq 5$.]

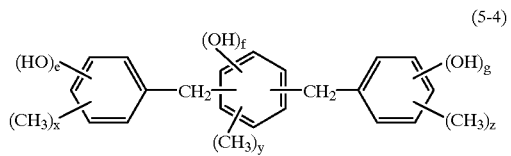

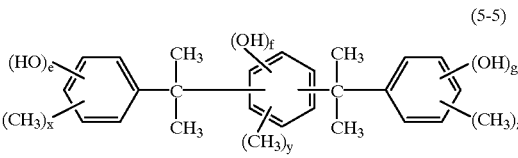

[In the formulas (5-4) and (5-5), e, f and g are independently an integer of 0 to 3, x, y and z are independently an integer of 0 to 3, provided that e, f and g are not 0 at the same time, $e+x \leq 5$, $f+y \leq 4$ and $g+z \leq 5$.]

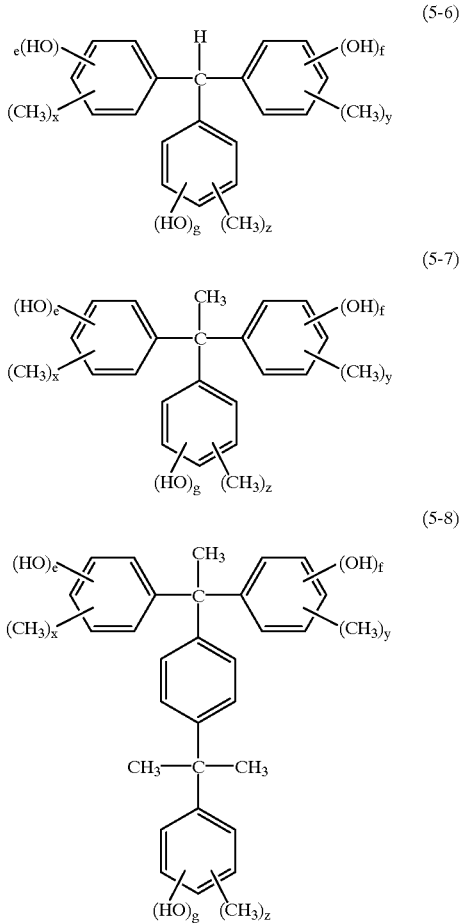

[In the formulas (5-6) to (5-8), e, f and g are independently an integer of 0 to 3, x, y and z are independently an integer of 0 to 3, provided that e, f and g are not 0 at the same time, $e+x \leq 5$, $f+y \leq 5$ and $g+z \leq 5$.]

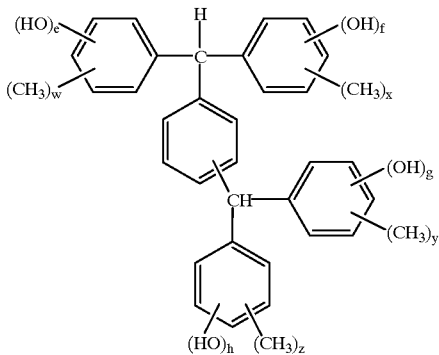

[In the formula (5-9), e, f, g and h are independently an integer of 0 to 3, w, x, y and z are independently an integer of 0 to 3, provided that e, f, g and h are not 0 at the same time, $e+w \leq 5$, $f+x \leq 5$, $g+y \leq 5$ and $h+z \leq 5$.]

Besides the compounds represented by the formulas (5-1) to (5-9), compounds such as 2,3,4-trihydroxybenzophenone, 2,3,4,4'-tetrahydroxybenzophenone, curcumin, and flavan may also be used as the dissolution accelerator.

The dissolution accelerator may usually be mixed in an amount of not more than 50 parts by weight, and preferably from 5 to 30 parts by weight, based on 100 parts by weight of the resin (i).

Surface Active Agent:

A surface active agent is used in order to improve coating properties and developability of the composition. The surface active agent may include, e.g., polyoxyethylene lauryl ether, polyoxyethylene octyl phenyl ether, polyoxyethylene nonyl phenyl ether, polyoxyethylene glycol dilaurate, polyoxyethylene glycol distearate, MEGAFACS F171, F172, F173 (trade name; available from Dainippon Ink & Chemicals, Incorporated), FLORARD FC430, FC431 (trade name; available from Sumitomo 3M Limited), ASAHI GUARD AG710, SURFRON S-382, SC-101, SC-102, SC-103, SC-104, SC-105, SC-106 (trade name; available from Asahi Glass Co., Ltd.) KP341 (trade name; available from Shin-Etsu Chemical Co., Ltd.), POLYFLOW No.75, No.95 (trade name; available from Koyeisha Chemical Co., Ltd.), and NBX-7, NBX-14, NBX-15 (trade name; available from NEOS Company Limited).

Any of these surface active agents may preferably be mixed in an amount of not more than 2 parts by weight based on 100 parts by weight of the solid matter of the composition.

The composition of the present invention may also be mixed with an adhesive auxiliary, a storage stabilizer, an antifoamer and so forth.

How to Prepare and Use the Radiation-Sensitive Resin Composition:

The composition of the present invention can be prepared by mixing the essential components and other components optionally added in prescribed amounts, and dissolving the resultant mixture in a solvent so as to be in a solid matter concentration of from 20 to 40% by weight, followed by filtration using a filter having a pore size of about 0.2 μm.

The solvent may include, e.g., ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate, propylene glycol monopropyl ether acetate, toluene, xylene, methyl ethyl ketone, 2-heptanone, 3-heptanone, 4-heptanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutane, methyl 3-methoxypropionate, ethyl 3-ethoxypropionate, ethyl 3-methoxypropionate, ethyl acetate, butyl acetate, methyl pyruvate, and ethyl pyruvate. Any of these solvents may be used alone or in combination of two or more.

To the solvent described above, it is also possible to add a high-boiling solvent such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, 7-butyrolactone, ethylene carbonate, propylene carbonate and ethylene glycol monophenyl ether acetate. Any of these solvents may also be used alone or in combination of two or more.

Formation of Resist Films and Patterns:

The composition of the present invention, prepared in the form of a solution, is coated on a substrate such as a silicon wafer or a wafer coated with aluminum, by a coating method such as rotary coating, flow-coating or roll coating.

Subsequently, the coating thus formed is pre-baked at 70 to 110° C. to form a resist film, and the resist film is selectively irradiated with radiation (hereinafter "exposure") at its predetermined positions. The desired pattern thus formed on the substrate is developed with a developing solution to form a pattern.

After the formation of the resist pattern and before the development, an operation of heating at 70 to 140° C. (hereinafter "post-exposure baking") may be added. This can make the present invention more effective.

The radiation may include ultraviolet radiation such as g-rays and i-rays, far-ultraviolet radiation such as excimer laser radiation, X-radiation such as synchrotron radiation and charged-particle radiation such as electron radiation, and ultraviolet radiation are preferred.

As the developing solution, an aqueous alkaline solution may be used which is prepared by dissolving an alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-azabicyclo-[5.4.0]-7-undecene and 1,5-diazabicyclo-[4.3.0]-5-nonane, in water in a concentration of, e.g., 1 to 10% by weight.

To the developing solution, a water-soluble organic solvent, e.g., an alcohol such as methanol and ethanol and a surface active agent may be added in appropriate quantities. After development carried out using such an aqueous alkaline solution, it is common to wash the surface with water such as pure water or ultra-pure water.

EXAMPLES

The present invention will be described below in greater detail by giving Examples. In the following, "part(s)" refers to "part(s) by weight".

Measurement and Evaluation

In the following Examples, measurement of Mw and evaluation of resists were made in the following way.

Mw:

Measured by gel permeation chromatography (GPC) with monodisperse polystyrene as a standard, using GPC columns G2000HXL (two columns), G3000HXL (one column) and G4000HXL (one column), available from Toso Co., Ltd., under analysis conditions of a flow rate of 1.0 ml/minute, an elution solvent tetrahydrofuran and a column temperature of 40° C.

Sensitivity:

The amount of exposure at which 0.35 μm line-and-space patterns were resolved in a ratio of 1:1 was indicated as sensitivity.

Resolution:

The minimum size in which 0.35 μm line-and-space patterns were resolved in a state free of pattern film loss, in the amount of exposure at which the patterns were resolved in a ratio of 1:1, was indicated as resolution.

Focal latitude:

Focal latitude was evaluated by measuring on a scanning electron microscope the shift width of focus (hereinafter "focal range") observed when in 0.35 82 m line-and-space patterns the size of patterns resolved is within plus-minus 10% of the designed size of a mask. It means that, the greater the focal range is, the better focal latitude is attained.

Heat resistance:

Substrates on which resist patterns had been formed were heated in an oven for 2 minutes, and the temperature at which 2.0 μm line-and-space patterns began to undergo thermal deformation was measured.

Developability:

Resist films of the composition were formed and then patterns were formed. Thereafter, the occurrence of scum or undeveloped residue was examined using a scanning electron microscope.

Figure 1B:
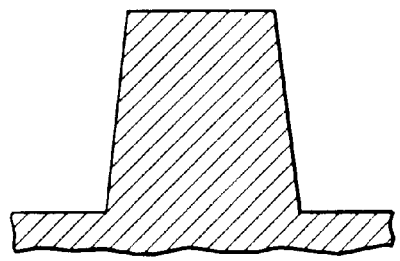
Figure 1C:
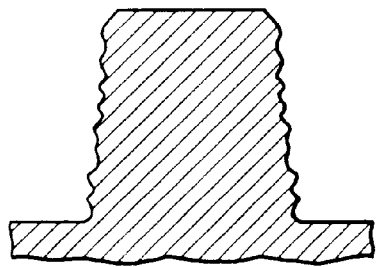
Figure 2:
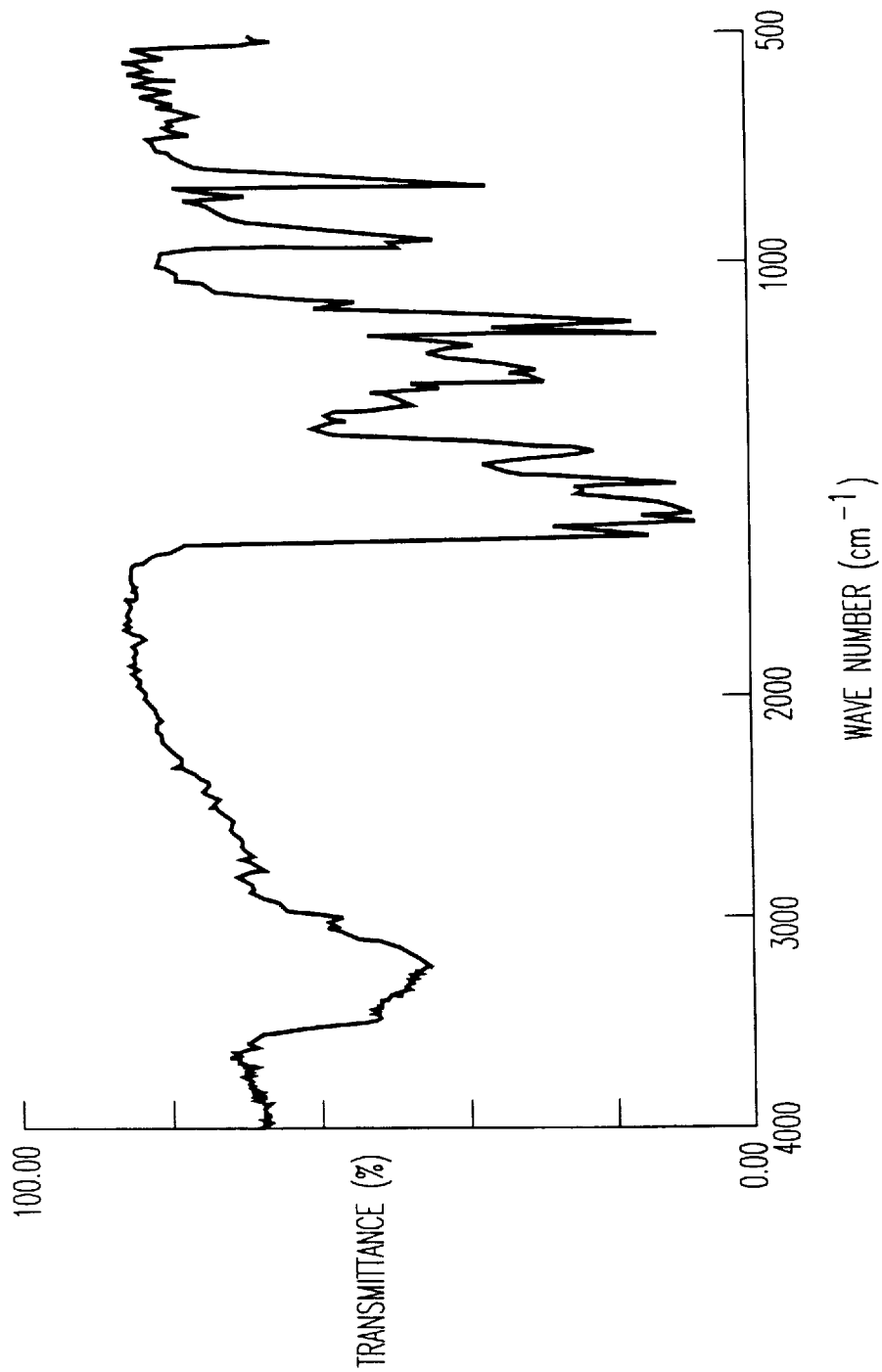
FIG. 2 is a chart showing a spectrum of infrared spectroscopy of a phenol compound (ii-1) obtained in Synthesis Example 1.

Pattern shape:

Cross sections of resist patterns of 0.35 μm were observed using a scanning electron microscope. Then, the shapes of cross sections of the patterns were grouped into three ranks (A) to (C) as shown in FIG. 1. More specifically, in FIG. 1, Rank (A) is an instance where the cross section has a vertical shape and also is not affected by standing waves; (B), an instance where the cross section has a tapered shape, but is not affected by standing waves, and (C), an instance where the cross section has a tapered shape and also is affected by standing waves.

Solvent solubility:

The phenol compound (ii) and the 1,2-quinonediazide compound (iii) were added in the solvent, and the mixture obtained was stirred at room temperature by means of a ball mill for 12 hours, and then the solution obtained was left to stand at room temperature for 1 hour. Thereafter, the concentration (weight ratio to the solvent) at which the solution began to be visually seen to become turbid was measured.

Evaluation on fine particles:

Resists were stored under temperature conditions of 35° C., room temperature, 0° C. and −15° C. for a month. After they were left to stand at room temperature for 24 hours, the number of fine particles with particle diameters of 0.3 μm or larger which were present in 1 cc of resist was counted using an automatic in-liquid fine particle counter KL-20, manufactured by Rion Co.

Synthesis of Resin (i)

Synthesis Example 1

In an autoclave;

| | |
|---|---|
| m-cresol | 69.2 g (0.64 mol); |
| 2,3-xylenol | 9.8 g (0.08 mol); |
| 3,4-xylenol | 9.8 g (0.08 mol); |
| an aqueous 37% by weight formaldehyde solution | 55.1 g (formaldehyde: 0.85 mol); |
| oxalic acid dihydrate | 5.0 g (0.04 mol); |
| water | 52.6 g; and |
| dioxane | 182 g | were charged, and this autoclave was immersed in an oil bath, and condensation was carried out with stirring while maintaining the bulk temperature at 130° C. After the reaction was completed, the reaction system was cooled to room temperature, and its contents were taken out into a beaker. After separated into two layers in this beaker, the lower layer was taken out, concentrated, and then dehydrated, followed by drying to collect a novolak resin. This resin was designated as resin (i-1). The resin (i-1) had an Mw of 8,600.

Synthesis Example 2

In an autoclave;

| m-cresol | 64.8 g (0.6 mol); |
| 2,3-xylenol | 36.7 g (0.3 mol); |
| 2,3,5-trimethylphenol | 13.6 g (0.1 mol); |
| an aqueous 37% by weight formaldehyde solution | 64.9 g (formaldehyde: 0.8 mol); |
| oxalic acid dihydrate | 6.3 g (0.05 mol); |
| water | 79.4 g; and |
| dioxane | 383.9 | were charged, and the subsequent procedure of Example 1 was repeated to synthesize a novolak resin. This resin was designated as resin (i-2). The resin (i-2) had an Mw of 8,300.

Synthesis of Phenol Compound (ii)

Synthesis Example 3

In a light-screened environment and in an flask having a stirrer, a dropping funnel and a thermometer;

| p-hydroxybenzaldehyde | 24.4 g (0.20 mol); and |
| acetylacetone | 10.1 g (0.10 mol) | were dissolved in 20 ml of N,N-dimethylformamide, followed by addition of 20.0 g (0.32 mol) of boric acid. Subsequently, this flask was immersed in a water bath controlled to 70° C., and its contents were stirred for 10 minutes. After the bulk temperature was dropped to room temperature, 20 ml of an N,N-dimethylformamide solution in which 2.0 ml of 1,2,3,4-tetrahydroquinoline and 6.0 ml of acetic acid were dissolved was dropwise added. Thereafter, the flask was immersed in a water bath controlled to 70° C., and its contents were stirred for 6 hours. After the bulk temperature was dropped to room temperature, the reaction mixture was put into 1,000 ml of an aqueous 50% acetic acid solution, and then stirred for 1 hour. Crystals thus deposited were collected, and washed with pure water, followed by purification by column chromatography (filler: silica gel; eluting solution: chloroform) to obtain 20.0 g (0.06 mol) of the phenol compound represented by the formula (4-1) as orange crystals. Herein, this compound was designated as phenol compound (ii-1). The phenol compound (ii-1) thus obtained was put to spectrometry using FT/IR-5300 (trade name), manufactured by Nippon Bunko K.K., to obtain the infrared spectrum as shown in FIG. 1.

Synthesis Example 4

The procedure of Synthesis Example 3 was repeated except that the p-hydroxybenzaldehyde was replaced with 28.8 g (0.16 mol) of 3,5-dimethoxy-4-hydroxybenzaldehyde. Thus, 25.5 g (0.06 mol) of the phenol compound represented by the formula (4-3) was obtained. Herein, this compound was designated as phenol compound (ii-2).

Synthesis of 1,2-quinonediazide Compound (iii)

Synthesis Example 5

In a light-screened environment;

| the phenol compound of the formula (4-1) | 5.5 g (0.018 mol); |
| 1,2-naphthoquinonediazido-5-sulfonic acid chloride | 4.0 g (0.015 mol); and |
| dioxane | 57 g | were charged into an flask having a stirrer, a dropping funnel and a thermometer, and dissolved with stirring. Subsequently, this flask was immersed in a water bath controlled to 30° C. At the time the bulk temperature became constant at 30° C., 1.7 g (0.017 mol) of triethylamine was added using a dropping funnel in such a manner that the bulk temperature did not become higher than 35° C., and the reaction was carried out at the same temperature for 2 hours. Thereafter, the triethylamine hydrochloride deposited was removed by filtration, and the resultant filtrate was poured into a large quantity of an aqueous dilute hydrochloric acid solution to cause the reaction product to precipitate. Then, the precipitate obtained was filtered and collected, followed by drying at 40° C. for 24 hours in a vacuum dryer to obtain 6.0 g of a 1,2-quinonediazidosulfonic acid ester (iii-1).

Synthesis Example 6

The procedure of Synthesis Example 5 was repeated except that the materials initially charged into the flask were replaced with;

| the phenol compound of the formula (4-3) | 5.8 g (0.014 mol); |
| 1,2-naphthoquinonediazido-5-sulfonyl chloride | 6.7 g (0.025 mol); and |
| dioxane | 75 g | and the amount of triethylamine was changed to 2.8 g (0.028 mol). Thus, 6.5 g of a 1,2-quinonediazide compound (iii-2) was obtained.

Synthesis Example 7

The procedure of Synthesis Example 5 was repeated except that the materials initially charged into the flask were replaced with;

a compound represented by the following formula:

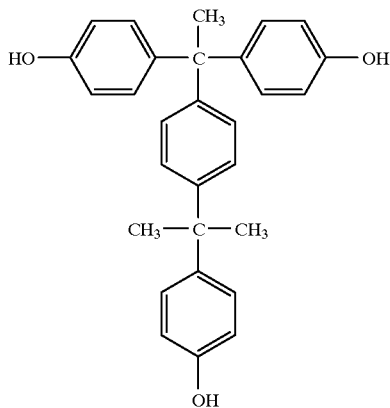

21.2 g (0.05 mol);
1,2-naphthoquinonediazido-5-sulfonyl chloride 33.6 g (0.125 mol); and
dioxane 330 g and the amount of triethylamine was changed to 13.9 g (0.138 mol). Thus, 33 g of a 1,2-quinonediazide compound (iii-3) was obtained.

Synthesis Example 8

The procedure of Synthesis Example 5 was repeated except that the materials initially charged into the flask were replaced with;

a compound represented by the following formula:

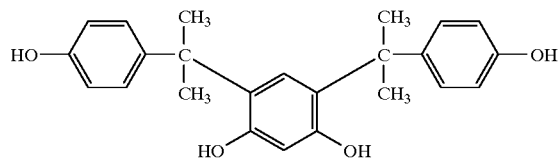

18.9 g (0.05 mol);
1,2-naphthoquinonediazido-5-sulfonyl chloride
20.1 g (0.075 mol); and dioxane 234 g and the amount of triethylamine was changed to 8.4 g (0.083 mol). Thus, 25.2 g of a 1,2-quinonediazide compound (iii-4) was obtained.

Examples 1 to 6

Under formulation as shown in Table 1, the resin (i), the phenol compound (ii), and the other dissolution accelerator, 1,2-quinonediazide compound (iii) and solvent were mixed to form uniform solutions, followed by filtration using a membrane filter with a pore size of 0.2 $\mu$m to produce solutions of the compositions.

The solutions thus obtained were each coated on a silicon wafer having a silicon oxide film, by means of a spin coater, followed by prebaking on a hot plate at 90° C. for 2 minutes to form a resist film of 1.1 $\mu$m thick. Next, through a reticle, the resist film was exposed to light of 365 nm in wavelength (i-rays) by means of a reduction projection aligner (numerical lens aperture: 0.57) NSR-2005i9C, manufactured by Nikon K.K., and then developed using an aqueous 2.38% by weight tetramethylammonium hydroxide solution, followed by rinsing with ultra-pure water and then drying to form resist patterns. The types of the dissolution accelerators and solvents used were as follows:

Dissolution accelerator:
α: 1,1-bis(4-hydroxy-2,5-dimethylphenyl)acetone
β: 1,1-bis(4-hydroxyphenyl)-1-phenylethane Solvents:
S1: ethyl 2-hydroxypropionate
S2: methyl 3-methoxypropionate
S3: methyl-n-amylketone Characteristics of the resist patterns obtained were evaluated by the methods described above.

Results obtained are shown in Table 2.

TABLE 1

| Example: | Resin (i) | | Phenol compound (ii) | | 1,2-Quinonediazide compound (iii) | | Dissolution accelerator | | Solvent | |
|---|---|---|---|---|---|---|---|---|---|---|
| | Type | Parts | Type | Parts | Type | Parts | Type | Parts | Type | Parts |
| 1 | i-1/ i-2 | 43/ 43 | ii-1 | 10 | iii-3 | 30 | α | 14 | S1 | 320 |
| 2 | i-1/ i-2 | 43/ 43 | ii-2 | 10 | iii-1/ iii-3/ iii-4 | 5/15/ 10 | β | 14 | S3 | 340 |
| 3 | i-1 | 85 | ii-1 | 10 | iii-3 | 25 | α | 15 | S1 | 320 |
| 4 | i-1/ i-2 | 42/ 42 | ii-2 | 5 | iii-2/ iii-4 | 10/ 25 | β | 16 | S2 | 320 |
| 5 | i-1 | 80 | — | — | iii-1/ iii-4 | 10/ 20 | α | 20 | S1 | 320 |
| 6 | i-1 | 80 | — | — | iii-2/ iii-4 | 5/25 | α | 20 | S3 | 340 |

TABLE 2

| Example | Sensitivity (msec) | Resolution (μm) | Developability | Focal range (μm) | Heat resistance(°C.) | Pattern shape |
|---|---|---|---|---|---|---|
| 1 | 480 | 0.28 | Good | 1.4 | 155 | (A) |
| 2 | 460 | 0.30 | Good | 1.4 | 150 | (A) |
| 3 | 480 | 0.32 | Good | 1.4 | 150 | (A) |
| 4 | 500 | 0.30 | Good | 1.4 | 150 | (A) |
| 5 | 440 | 0.30 | Good | 1.4 | 150 | (A) |
| 6 | 410 | 0.30 | Good | 1.2 | 155 | (A) |

Examples 7 to 10, Comparative Example 1

With regard to Compounds (ii-1) and (ii-2) of the phenol compound (ii), Compounds (iii-1) and (iii-2) of the 1,2-quinonediazide compound (iii) and a comparative compound (c) represented by the following formula:

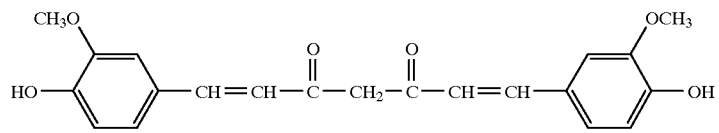

their solvent solubility in the three types of solvents S1 to S3 was measured by the method described above. S1, S2 and S3 are as described at the section of Examples 1–6.

Results obtained are shown in Table 3.

TABLE 3

| | | Solvent solubility (wt. %) | | |
|---|---|---|---|---|
| | Compound | S1 | S2 | S3 |
| Example: | | | | |
| 7 | (ii-1) | 3.2 | 6.1 | 6.7 |
| 8 | (ii-2) | 1.5 | 6.9 | 5.8 |
| 9 | (iii-1) | 6.5 | 7.4 | 7.2 |
| 10 | (iii-2) | 7.2 | 7.6 | 6.8 |
| Comparative Example 1 | (c) | 0.6 | 1.3 | 1.3 |

Examples 11 to 14, Comparative Example 2

80 parts of the resin (i-1), 20 parts of the dissolution accelerator (α), 30 parts of the 1,2-quinonediazide compound (iii-3), 4 parts of the phenol compound (ii-1), the phenol compound (ii-2), 1,2-quinonediazide compound (iii-1), 1,2-quinonediazide compound (iii-2) or the comparative compound (c) mentioned above and 350 parts of the solvent (S1) were mixed to form uniform solutions, followed by filtration using a membrane filter with a pore size of 0.1 μm to produce solutions of the compositions. Occurrence of fine particles in the solutions was examined to make evaluation by the method described above.

Results obtained are shown in table 4.

TABLE 4

| Example | Compound contained | Number of fine particles occurred | | | |
|---|---|---|---|---|---|
| | | 35° C. | Room temp. | 0° C. | −15° C. |
| 11 | (ii-1) | 21 | 20 | 24 | 22 |
| 12 | (ii-2) | 27 | 22 | 21 | 24 |
| 13 | (iii-1) | 22 | 21 | 25 | 23 |
| 14 | (iii-2) | 28 | 24 | 23 | 25 |
| Comparative Example 2 | (c) | 1448 | 1105 | 1598 | 1812 |

What is claimed is:

1. A radiation-sensitive resin composition comprising:

(i) an alkali-soluble resin;

(ii) a phenol compound represented by the following formula (1):

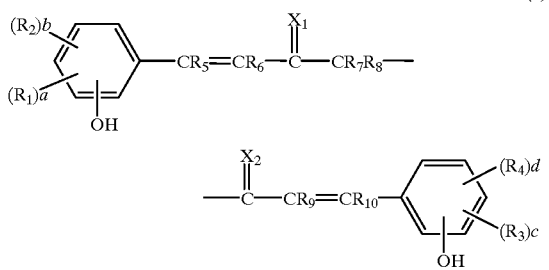

wherein $R_1$ to $R_4$ are the same or different and each represent a halogen atom, an alkyl group, an alkoxyl group, an aryl group, a nitro group, a cyano group, a hydroxyalkyl group, a hydroxyalkoxyl group or a hydroxyl group; a, b, c and d independently represent an integer of 0 to 4 and satisfying $0 \leq a+b \leq 4$ and $0 \leq c+d \leq 4$, provided that when a+b is 1 and c+d is 1 at least one of $R_1$ or $R_2$ and $R_3$ or $R_4$ to be present is an alkyl group, a hydroxyalkyl group or a hydroxyalkoxyl group; $R_5$ to $R_{10}$ are the same or different and each represent a hydrogen atom, an alkyl group or an aryl group; and $X_1$ and $X_2$ are the same or different and each represent an oxygen atom or a sulfur atom; and (iii) a 1,2-quinonediazide compound.

2. A radiation-sensitive resin composition comprising:

(i) an alkali-soluble resin;

(ii) a phenol compound represented by the following formula (1):

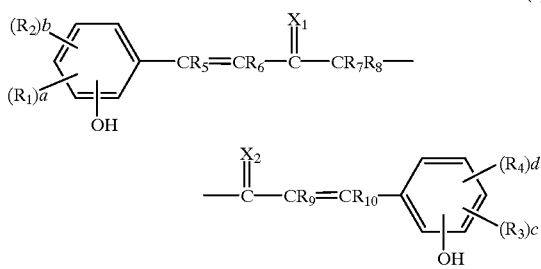

(1)

wherein $R_1$ to $R_4$ are the same or different and each represent a halogen atom, an alkyl group, an alkoxyl group, an aryl group, a nitro group, a cyano group, a hydroxyalkyl group, a hydroxyalkoxyl group or a hydroxyl group; a, b, c and d independently represent an integer of 0 to 4 and satisfying $0 \leq a+b \leq 4$ and $0 \leq c+d \leq 4$, provided that when a+b is 1 and at least one of $R_1$ or $R_2$ and $R_3$ or $R_4$ to be present is an alkyl group, a hydroxyalkyl group or a hydroxyalkoxyl group; $R_5$ to $R_{10}$ are the same or different and each represent a hydrogen atom, an alkyl group or an aryl group; and $X_1$ and $X_2$ are the same or different and each represent an oxygen atom or a sulfur atom, provided that when both $X_1$ and $X_2$ are oxygen, a+b or c+d is at least 1 and at least one of $R_1$ and $R_2$ is a hydroxyalkyl or a hydroxyalkoxyl group; and (iii) a 1,2-quinonediazide compound.

3. The composition of claim 1, which is a radiation-sensitive photoresist composition.

4. The composition of claim 1, wherein the component-(i) alkali-soluble resin is selected from the group consisting of an alkali-soluble phenol resin, polyvinyl phenol, a derivative of the polyvinyl phenol, a styrene-maleic anhydride copolymer, a derivative of the styrene-maleic anhydride copolymer, polyvinyl hydroxybenzoate and an acrylic acid resin containing a carboxyl group.

5. The composition of claim 1, wherein the component-(i) alkali-soluble resin is a resin having a weight average molecular weight of from 2,000 to 20,000 in terms of polystyrene.

6. The composition of claim 1, wherein the component-(i) alkali-soluble resin is an alkali-soluble phenol resin having an average molecular weight of from 5,000 to 14,000 in terms of polystyrene.

7. The composition of claim 1, wherein the component-(ii) phenol compound is a compound selected from the group consisting of compounds represented by the following formulas (4-1) to (4-8),

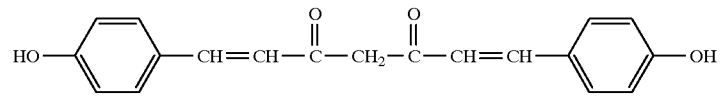

(4-1)

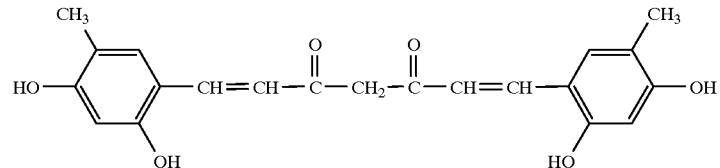

(4-2)

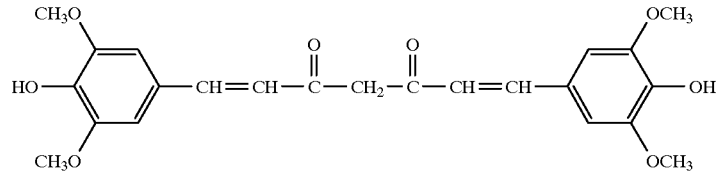

(4-3)

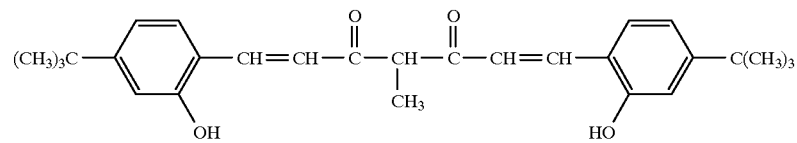

(4-4)

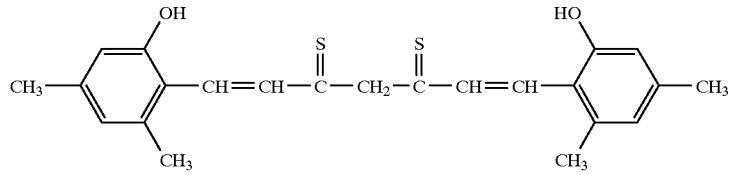

(4-5)

-continued

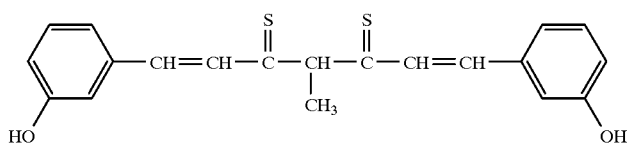
(4-6)

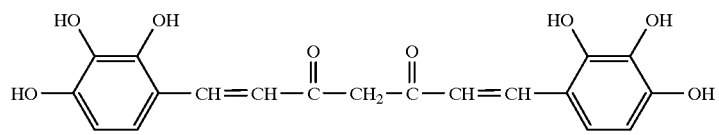
(4-7)

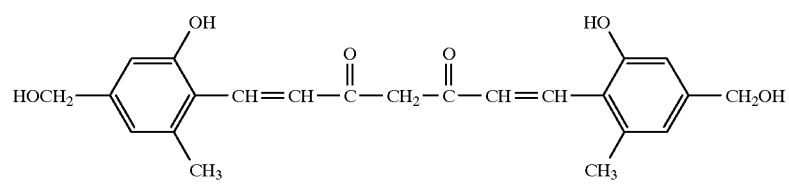
(4-8)

8. The composition of claim 7, wherein the component-(ii) phenol compound is a compound selected from the group consisting of compounds represented by the formulas (4-1), (4-2), (4-3) and (4-7).

9. The composition of claim 1, wherein the component-(iii) 1,2-quinonediazide compound is a 1,2-benzoquinonediazidosulfonic acid ester of a compound selected from the group consisting of 2,3,4-trihydroxybenzophenone, 2,3,4,4'-tetrahydroxybenzophenone, 2,3,4,2',4'-pentahydroxybenzophenone, tris(4-hydroxyphenyl)methane, 1,3,5-tris(4-hydroxy-α,α-dimethylbenzyl)benzene, 1,1-bis-(4-hydroxyphenyl)-1-[4-{1-(4-hydroxyphenyl)-1-methylethyl}phenyl]ethane, 2-(3,4-dihydroxyphenyl)-2-(4-hydroxyphenyl)propane, 2,4,4-trimethyl-2-(2,4-dihydroxyphenyl)-7-hydroxycumarone and the phenol compound represented by the formula (1) defined in claim 1.

10. The composition of claim 9, wherein said 1,2-benzoquinonediazidosulfonic acid ester is 1,2-benzoquinonediazido-4-sulfonic acid ester or 1,2-benzoquinonediazido-5-sulfonic acid ester.

11. The composition of claim 1, wherein the component-(i), the component-(ii) and the component-(iii) are present in an amount of 100 parts by weight, from 1 part by weight to 50 parts by weight and from 10 parts by weight to 50 parts by weight, respectively.

12. The composition of claim 1, which further comprises a dissolution accelerator.

13. The composition of claim 12, wherein said dissolution accelerator comprises a low-molecular weight phenol compound other than the component-(ii) represented by the formula (1) defined in claim 1.

14. The composition of claim 13, wherein said low-molecular weight phenol compound is selected from the group consisting of compounds represented by the following formulas (5-1) to (5-9),

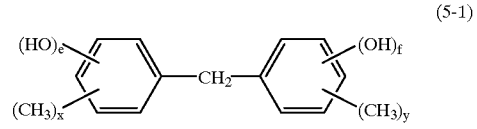
(5-1)

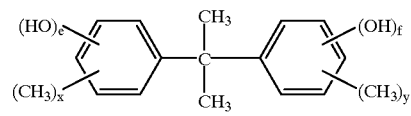
(5-2)

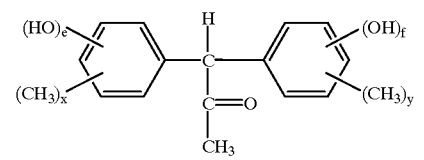
(5-3)

wherein e and f are independently an integer of 0 to 3, x and y are independently an integer of 0 to 3, provided that e and f are not 0 at the same time, e+x≦5 and f+y≦7,

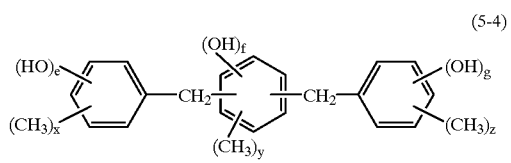
(5-4)

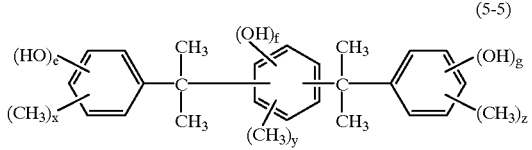
(5-5)

wherein e, f and g are independently an integer of 0 to 3, x, y and z are independently an integer of 0 to 3, provided that e, f and g are not 0 at the same time, e+x≦5, f+y≦4 and g+z≦5,

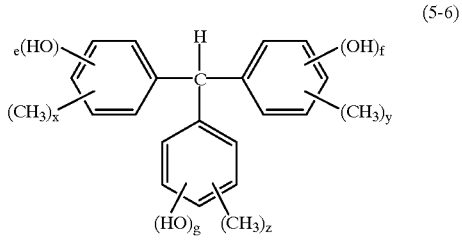
(5-6)

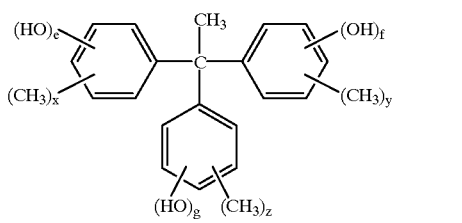
(5-7)

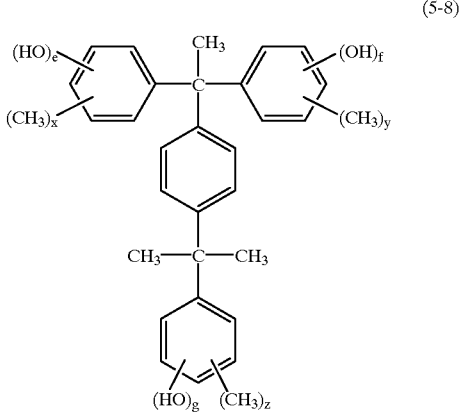
(5-8)

wherein e, f and g are independently an integer of 0 to 3, x, y and z are independently an integer of 0 to 3, provided that e, f and g are not 0 at the same time, e+x≦5, f+y≦5 and g+z≦5,

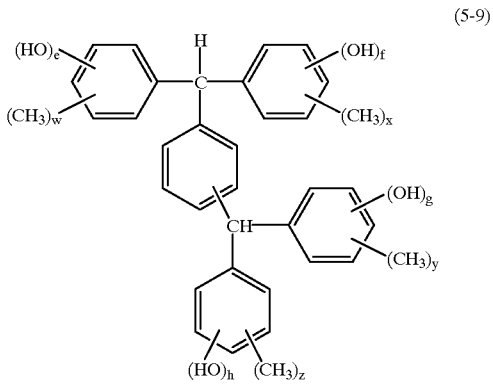
(5-9)

wherein e, f, g and h are independently an integer of 0 to 3, w, x, y and z are independently an integer of 0 to 3, provided that e, f, g and h are not 0 at the same time, e+w≦5, f+x≦5, g+y≦5 and h+z≦5.

15. The composition of claim 13, wherein said low-molecular weight phenol compound is selected from the group consisting of the compounds represented by the formulas (5-3), (5-5), (5-6) and (5-7).

16. A pattern-forming process comprising the steps of:
coating on a substrate the radiation-sensitive resin composition according to claim 1 to form a coating;
prebaking the coating to form a resist film;
selectively exposing the resist film to radiation to form a given resist pattern; and
developing the resist pattern by the use of a developing solution.

17. The process of claim 16, wherein said radiation is ultraviolet radiation, X-radiation or charged-particle radiation.

18. A radiation-sensitive resin composition comprising:
(i) an alkali-soluble resin; and
(iiia) a 1,2-benzoquinonediazidosulfonic acid ester of the compound represented by the formula (1) defined in claim 1.

19. The composition of claim 18, wherein the component-(iiia) is present in an amount of from 1 part by weight to 30 parts by weight based on 100 parts by weight of the component (i).

20. A pattern-forming process comprising the steps of:
coating on a substrate the radiation-sensitive resin composition according to claim 16 to form a coating;
prebaking the coating to form a resist film;
selectively exposing the resist film to radiation to form a given resist pattern; and
developing the resist pattern by the use of a developing solution.

21. The process of claim 20, wherein said radiation is ultraviolet radiation, X-radiation or charged-particle radiation.

* * * * *